United States Patent [19]
Witte et al.

[11] Patent Number: 6,112,738
[45] Date of Patent: Sep. 5, 2000

[54] METHOD OF SLICING SILICON WAFERS FOR LASER MARKING

[75] Inventors: Dale A. Witte, O'Fallon; Tracy Ragan, Warrenton, both of Mo.

[73] Assignee: MEMC Electronics Materials, Inc., St. Peters, Mo.

[21] Appl. No.: 09/285,337

[22] Filed: Apr. 2, 1999

[51] Int. Cl.$^7$ ........................................... B28D 1/08
[52] U.S. Cl. ........................................... 125/16.02; 125/21
[58] Field of Search ............................. 125/13.03, 16.01, 125/16.02, 16.03, 16.04, 21; 451/387, 396

[56] References Cited

U.S. PATENT DOCUMENTS

| | | | |
|---|---|---|---|
| 5,269,285 | 12/1993 | Toyama et al. | 125/16.01 |
| 5,610,104 | 3/1997 | Mitchell | 437/238 |
| 5,715,806 | 2/1998 | Tonegawa et al. | 125/16.02 |
| 5,735,258 | 4/1998 | Ukuno et al. | 125/16.02 |
| 5,810,643 | 9/1998 | Toyama | 451/5 |
| 5,875,769 | 3/1999 | Toyama et al. | 125/16.01 |
| 5,875,770 | 3/1999 | Fukunaga | 125/16.02 |
| 5,931,147 | 8/1999 | Nakazato et al. | 125/16.02 |
| 5,937,844 | 8/1999 | Kiuchi et al. | 125/16.02 |

FOREIGN PATENT DOCUMENTS

| | | | |
|---|---|---|---|
| 755751A1 | 7/1996 | European Pat. Off. | |
| 798405A2 | 3/1997 | European Pat. Off. | |
| 404008472 | 1/1992 | Japan | 125/16.02 |

Primary Examiner—Timothy V. Eley
Attorney, Agent, or Firm—Senniger, Powers, Leavitt & Roedel

[57] ABSTRACT

Methods of slicing ingots of semiconductor material into wafers using a wire saw. The wire saw includes a wire that is movable in a forward direction and a reverse direction for slicing the ingots. The methods include defining an identification region of each wafer to be sliced from the ingots and aligning an alignment feature of the ingots in approximately the same position relative to the wire saw for each of the ingots. The identification region of the wafer is adapted for marking with an identification mark after slicing. The methods also include slicing the ingot into wafers with the wire saw. The slicing step includes moving the wire in the forward and reverse directions during slicing except when slicing in the identification region of each wafer and moving the wire only in the forward direction when slicing in the identification region of each wafer. In slicing the ingot into wafers, thickness variations relative to the size of the identification mark are reduced in the identification region.

14 Claims, 4 Drawing Sheets

METHOD OF SLICING SILICON WAFERS FOR LASER MARKING

BACKGROUND OF THE INVENTION

This invention relates generally to wafer slicing and, particularly, to methods of slicing a semiconductor wafer for improved quality control in laser marking the wafer.

Most processes for fabricating semiconductor electronic components start with monocrystalline, or single crystal, silicon in the form of wafers. Semiconductor wafers are produced by thinly slicing a single crystal silicon ingot into individual wafers with a cutting apparatus, such as a wire saw. In general, the wire saw uses a wire mounted on rollers for cutting the ingot. The drive mechanism of the wire saw moves the wire back and forth in a lengthwise direction around the rollers at an average speed of, for example, 10 to 15 meters per second. Commonly assigned U.S. Pat. No. 5,735,258, the entire disclosure of which is incorporated herein by reference, discloses a wire saw apparatus for slicing silicon wafers.

The wafer slicing process typically produces undesirable wafer characteristics such as thickness variations, warp, saw marks and kerf loss. These undesirable characteristics usually can be reduced to a satisfactory level or eliminated by presently available post-slicing processing operations. For example, each as-cut wafer undergoes a number of processing operations to shape it, reduce its thickness, remove damage caused by the slicing operation, and to create a highly reflective surface. In addition, the wafers typically undergo various inspections as part of post-slicing processing.

Wafer producers often use identification marks on the silicon wafers to track them through the various wafering processes. In this manner, different marks can be used to indicate different wafer characteristics, identify the source of defective wafers or otherwise trace the origin of a particular wafer or lot of wafers. For example, a series of laser-scribed dots (also referred to as hard marking) may be used to form an identification number on the front surface of a wafer. Lumonics sells a number of suitable dot matrix machines under the trademark WaferMark® for hard marking identification marks on silicon wafers with a laser.

Those skilled in the art recognize that hard marking as-cut wafers provides cost benefits over, for example, soft marking polished wafers. In addition, marking wafers relatively early in the process, before they undergo further operations, permits more accurate and complete tracking of the wafers through the various stages of wafer processing. However, a problem associated with hard laser marking as-cut wafers is the inability to accurately control the dot depth and diameter of the marks on the final polished wafer. This is because of the thickness variations and wire marks that are typically present with wafers sliced with a wire saw (conventional as-cut wafers have a thickness distribution with a standard deviation of approximately 3 $\mu$m and a thickness variation around the wafer edge of approximately 8 $\mu$m).

FIG. 1 is a fragmentary, cross-sectional view of an as-cut wafer 12 sliced in accordance with the prior art. The back and forth cutting action of the wire saw causes wire marks, indicated generally at reference character 14, on a surface 16 of the wafer 12. The spacing between the wire marks 14 is a function of the back and forth cycle time and the speed of relative motion between the ingot being sliced and the wire. Typically, this spacing is on the order of about ⅓ mm (approximately 387 $\mu$m in FIG. 1). For convenience, the spacing between wire marks 14 is indicated by reference character T shown between high spots 20 on the surface 16 of wafer 12. The depth of marks 14 depends not only on the back and forth cycle time of the wire saw but also the size of the abrasive in the wire saw slurry. In FIG. 1, the depth D of wire marks 14 relative to the high spots 20 is about 24 $\mu$m.

FIG. 1 also illustrates a series of laser-scribed marks 22, which form part of an identification marking on the surface 16 of wafer 12. Preferably, each mark 22 has a generally cylindrical wall and a generally hemispherical bottom and appears as a dot when viewed from above. Conventional marking techniques include marking the surface 16 of wafer 12 with an identifying code formed in an 8×32 grid of dots (often referred to as a T7 marking) (see FIG. 2). In addition, wafer 12 is usually marked with an alphanumeric identifier (often referred to as an M12 marking) (see FIG. 2), which is also made up of a series of laser-scribed marks 22.

As described above, each as-cut wafer 12 undergoes a number of processing operations to shape it, reduce its thickness, remove damage caused by the slicing operation, and to create a highly reflective surface. These post-slicing processes typically involve the removal of up to 50 $\mu$m or more of semiconductor material from the surface 16 of wafer 12. A line 24 shows the position of an exemplary final polished surface of wafer 12. As a result, thickness variations in general, and wire marks 14 in particular, make it difficult to meet customer specifications for dot depth and diameter on the final polished wafer when the initial marks are placed on an as-cut surface, such as surface 16. Exemplary laser marking specifications call for dots having a depth of 45 $\mu$m±15 $\mu$m and a diameter of 85 $\mu$m±15 $\mu$m. According to conventional laser marking techniques, a laser apparatus scribes marks 22 into the surface 16 of wafer 12 at a depth of about 100 $\mu$m. After removal of material in the post-slicing operations, the depth and/or diameter of the laser markings may or may not fall within the customer specifications for finished wafers. FIG. 1 shows that the depths of marks 22 relative to the line 24 may vary significantly from one mark to another.

For these reasons, a method of slicing wafers that reduces thickness variations and wire marks and that permits accurate dot depth and diameter control of hard laser marking identification numbers is desired.

SUMMARY OF THE INVENTION

The invention meets the above needs and overcomes the deficiencies of the prior art by providing improved methods of slicing wafers from ingots of semiconductor material. Among the several objects and features of the present invention may be noted the provision of such methods that reduce thickness variations in certain regions of the wafers; the provision of such methods that provide improved accuracy and control of laser-scribed identification markings on the wafers; the provision of such methods that permit hard marking as-cut wafers; and the provision of such methods that are economically feasible and commercially practical.

Briefly described, a method embodying aspects of the invention includes the step of defining an identification region of each wafer to be sliced from an ingot of semiconductor material using a wire saw. The wire saw includes a wire that is movable in a forward direction and a reverse direction for slicing the ingot. The identification region of the wafer is adapted for marking with an identification mark after slicing. The method also includes the step of slicing the ingot into wafers with the wire saw. The slicing step includes moving the wire in the forward and reverse directions during slicing except when slicing in the identification region of each wafer and moving the wire only in the forward direction when slicing in the identification region of each wafer. In slicing the ingot into wafers, thickness variations relative to the size of the identification mark are reduced in the identification region.

Another embodiment of the invention is directed to a method of slicing ingots of semiconductor material into wafers using a wire saw. The ingots each include an outer surface having an alignment feature. The wire saw includes a wire that is movable in a forward direction and a reverse direction for slicing the ingots. The method includes the steps of aligning the alignment features of the ingots in approximately the same position relative to the wire saw for each of the ingots and slicing each ingot into wafers with the wire saw. The slicing step includes moving the wire in the forward and reverse directions when slicing in a first region of each wafer and moving the wire only in the forward direction when slicing in a second region of each wafer. In slicing the ingots into wafers, thickness variations are reduced in the second region.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
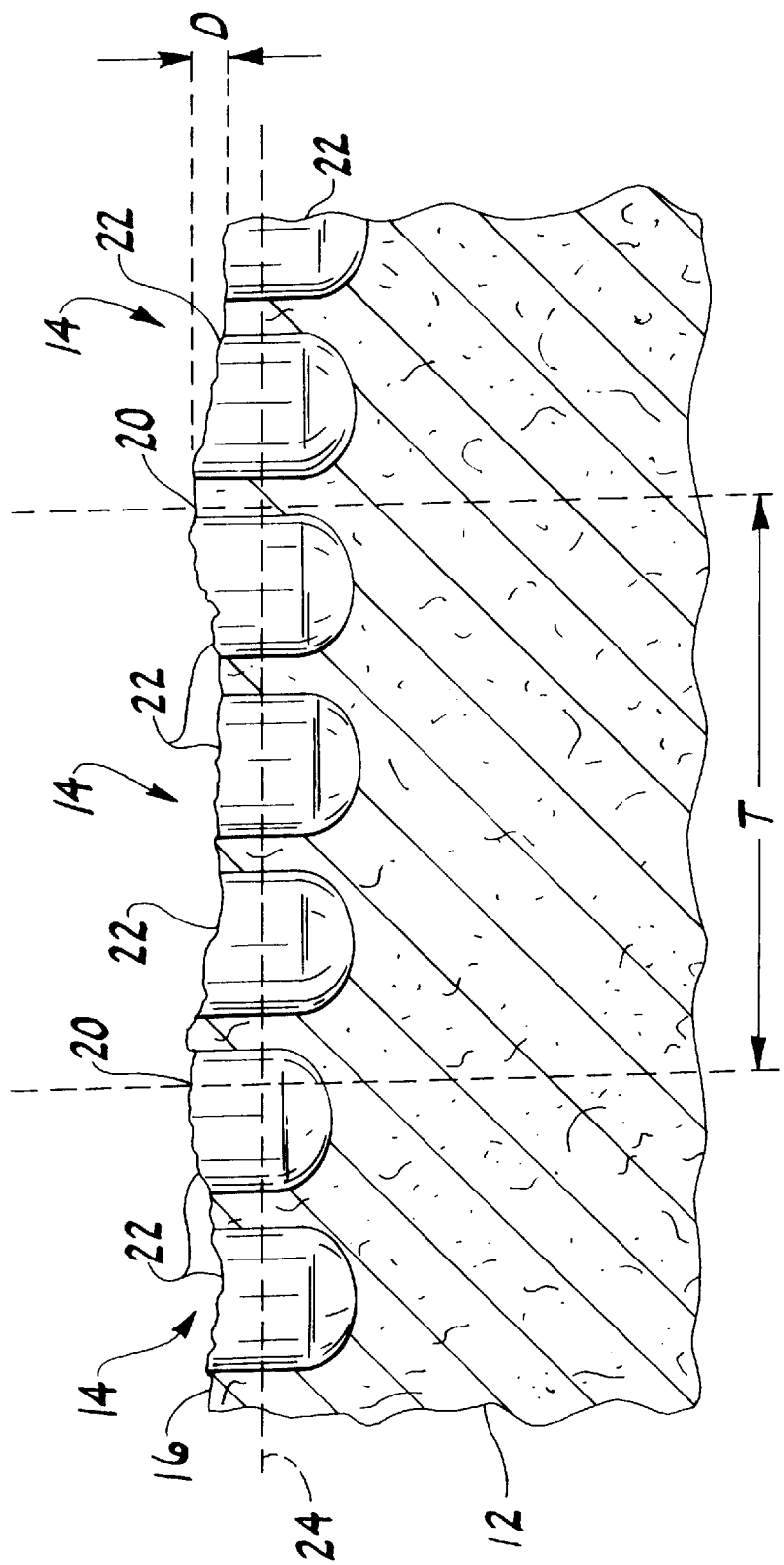
FIG. 1 is a fragmentary cross section of a wafer sliced from an ingot using a wire saw according to the prior art.
Figure 2:
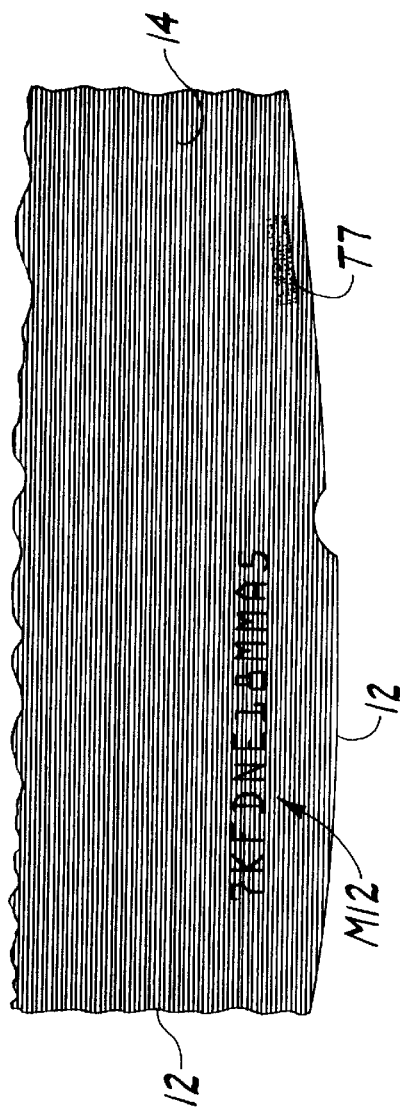
FIG. 2 is a fragmentary top view of the wafer of FIG. 1.
Figure 4:
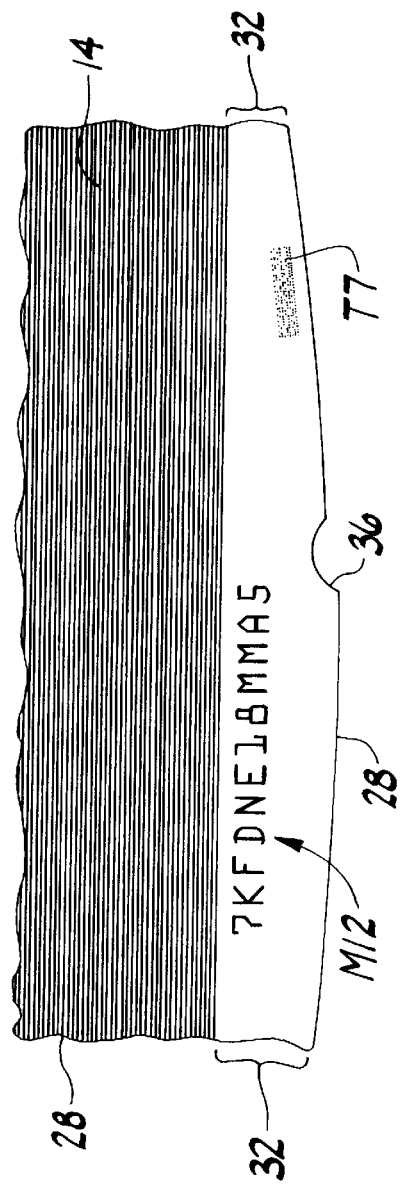
FIG. 4 is a fragmentary top view of the wafer of FIG. 3.
Figure 3:
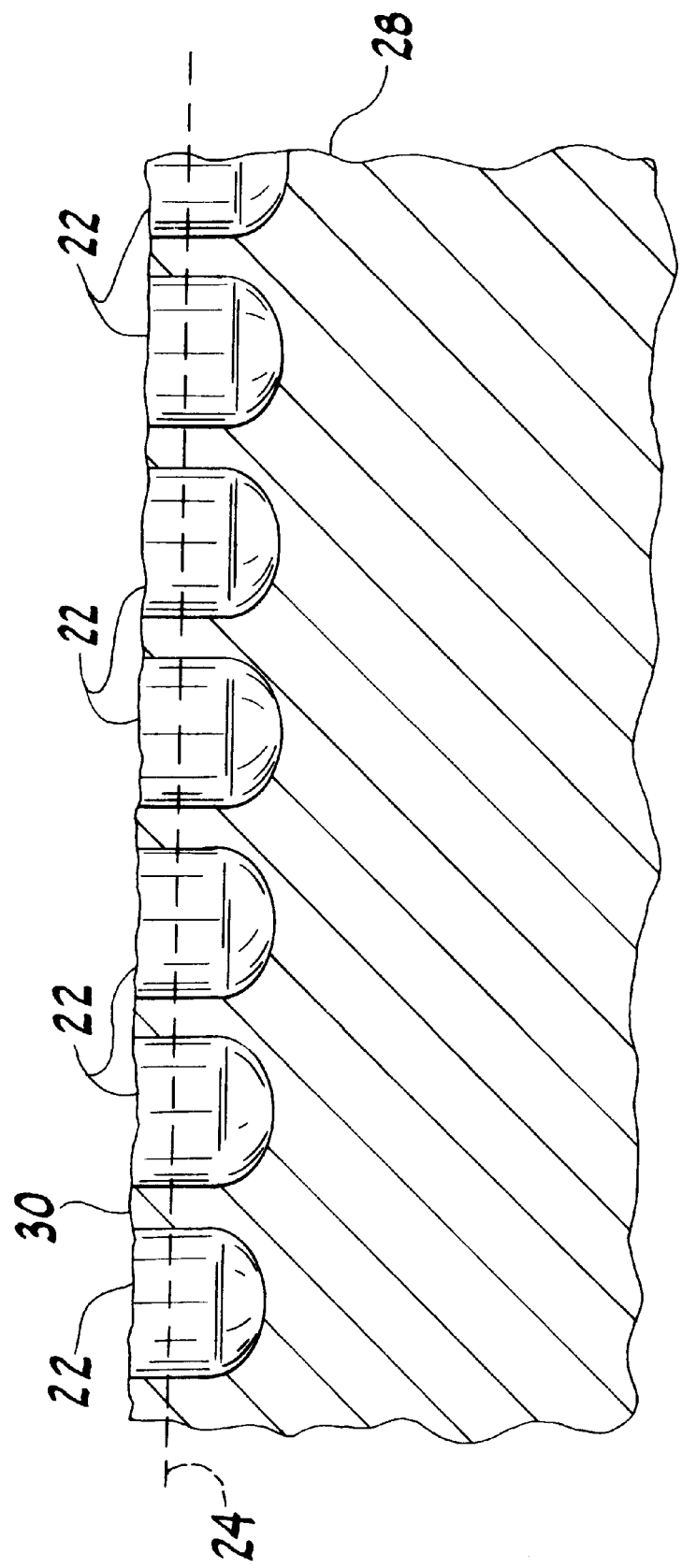
FIG. 3 is a fragmentary cross section of an exemplary wafer sliced from an ingot using a wire saw according to a preferred embodiment of the invention.

Referring now to FIG. 3, an as-cut wafer 28 of semiconductor material that embodies aspects of the present invention has a surface 30 with an identification region 32 (see FIG. 4). The identification region 32 is substantially free of thickness variations due to wire marks 14 and is adapted for laser-scribing with an identification marking. FIG. 3 also illustrates the series of laser-scribed marks 22, which form part of the identification marking on the surface 30 of wafer 28. Line 24 again shows the position of an exemplary final polished surface of wafer 28 after post-slicing processes remove semiconductor material from the surface 30 of wafer 28. Advantageously, the depths of marks 22 relative to line 24 do not vary significantly from one mark to another even after removal of material in the post-slicing operations.

The wafer 28, preferably sliced from an ingot of single crystal silicon, may have any diameter and target thickness that is appropriate for a semiconductor application. For example, the diameter of wafer 28 is from about 100 mm to about 300 mm or greater and its thickness is about 475 $\mu$m to about 900 $\mu$m or greater. Typically, the desired wafer thickness increases with increasing wafer diameter. Although wafer 28 may have any crystal orientation, most semiconductor applications use a <100> or <111> crystal orientation.

In FIG. 4, an exemplary T7 grid marking and an exemplary M12 alphanumeric identifier are laser-scribed into wafer surface 30 at the identification region 32. Preferably, identification region 32 is situated at the periphery of wafer 28 near a notch 36 in the outer edge of wafer 28. The notch 36 provides a reference for defining identification region 32. Those skilled in the art recognize the use of an alignment feature on the outer surface of the ingot, such as notch 36, for identifying crystal orientation, for example. Another known alignment feature is a facet ground into the outer surface of the ingot.

Figure 5:
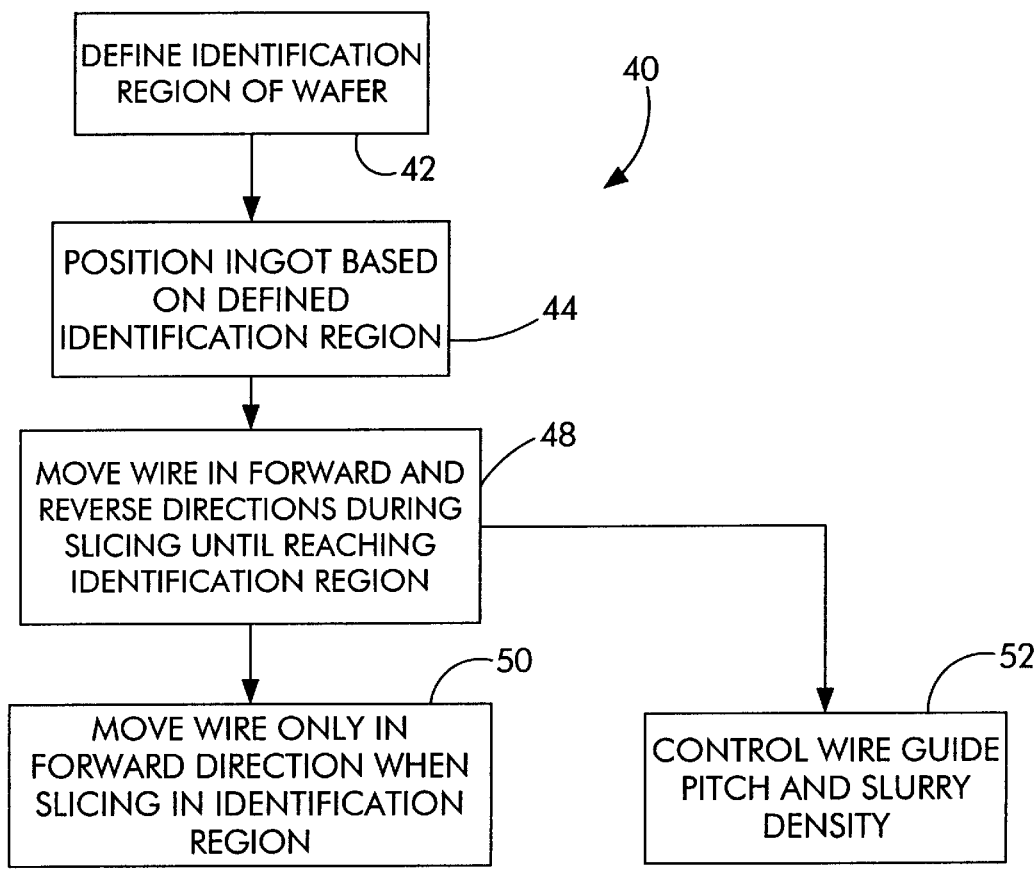
FIG. 5 is a flow diagram illustrating a method of slicing wafers for laser marking according to a preferred embodiment of the invention.

Referring now to FIG. 5, a flow diagram 40 illustrates a method of slicing an ingot of semiconductor material into wafers according to a preferred embodiment of the present invention. Beginning at step 42, an operator defines identification region 32 for the wafers to be sliced from the ingot. Identification region 32, for example, provides an area for laser marking wafer 28 adjacent notch 36. Proceeding to step 44, the operator positions the ingot for slicing relative to the wire saw based on the defined identification region 32. The operator mounts notch 36 in the same location for each ingot, preferably in a start cut position that is straight down when the ingot is in the wire saw. In other words, the operator preferably positions notch 36, or another alignment feature on the ingot, downwardly relative to the direction of cutting.

The wire saw begins slicing the ingot into wafers at step 48 by moving its wire in a back and forth motion as the wire saw and ingot feed relatively toward each other along a linear feed path. This forces the wire and the ingot together during slicing. In one embodiment, the wire saw has, for example, a slurry mixture density of about 1.63 g/cc to about 1.65 g/cc, a wire speed of about 10 m/sec to about 15 m/sec, a total cycle length of approximately 500 meters and a back/forth ratio of approximately 2:3.

The wire saw continues moving the wire back and forth during slicing of a first region of wafer 28 until the saw reaches a second region, namely, identification region 32. Upon reaching identification region 32, the wire saw changes its cutting at step 50 to move the wire only in the forward direction rather than in a back and forth motion. Slicing in this manner reduces thickness variations in wafer 28 relative to the size of the laser-scribed identification marks 22 by eliminating wire marks 14 in the surface 30 of wafer 28 in identification region 32. However, advancing the wire during slicing uses more wire per amount of ingot cut than would otherwise be used during conventional back and forth slicing. Moreover, prolonged single direction slicing may result in a taper (i.e., more material being removed at the back end of the cut than at the front end). For these reasons, single direction slicing with a wire saw is generally undesirable. The present invention, however, minimizes these disadvantages by defining identification region 32 to be near the periphery of wafer 28 adjacent notch 36 and by positioning the ingot with notch 36 in a downward position relative to the direction of cutting. This ensures that almost the entire diameter of the ingot is sliced with a back and forth wire motion before reaching identification region 32. In general, identification markings are wider than they are tall (e.g., a string of alphanumeric characters). For this reason, the operator preferably defines identification region 32 to be situated generally horizontally and having a width and height that are greater or equal to the width and height of the laser marking.

As is known in the art, the wire saw includes a plurality of guides for arranging its wire in a plurality of substantially parallel, regularly spaced lines. The guides define wire guide pitch (i.e., the spacing between the adjacent portions of the wire). At step 52, the method of FIG. 5 provides for controlling wire guide pitch. In general, the wire guide pitch control of step 52 is performed during the preparation of the wire guide for installation on a wire saw. This control involves eliminating machining errors and accurately accounting for wire wear to reduce thickness variations in the as-cut wafers.

Step 52 also includes controlling the density of the abrasive slurry in the contact area between the wire and the ingot by using a statistical process control. In general, newer slurry is less dense and leads to the production of thinner wafers with greater total thickness variation whereas older slurry is more dense and leads to the production of thicker wafers with lesser total thickness variation. For this reason, consistent slurry density is desired. Conventional slurry control involves an open loop process of replacing a portion of the total volume of slurry between slicing runs. The amount of slurry replaced is a function of the size of the ingot most recently sliced. Advantageously, the method of the present invention contemplates a closed loop process for controlling thickness variations by maintaining slurry density relatively constant from one slicing run to the next.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A method of slicing an ingot of semiconductor material into wafers using a wire saw, said wire saw including a wire for slicing the ingot, said wire being movable in a forward direction and a reverse direction during slicing, said method comprising the steps of:

defining an identification region of each wafer to be sliced from the ingot, said identification region of each wafer being adapted for marking with a series of laser-scribed marks after slicing, said laser-scribed marks forming an identification mark; and slicing the ingot into wafers with the wire saw, said slicing step comprising:

moving the wire in the forward and reverse directions during slicing except when slicing in the identification region of each wafer; and moving the wire only in the forward direction when slicing in the identification region of each wafer whereby thickness variations in each wafer relative to the size of the identification mark are reduced in the identification region of each wafer.

2. The method of claim 1 further comprising the step of positioning the ingot for slicing relative to the wire saw based on the defined identification region of each wafer.

3. The method of claim 1 wherein the ingot includes an outer surface having an alignment feature and wherein the identification region is defined to be adjacent the alignment feature.

4. The method of claim 3 further comprising the steps of aligning the alignment feature of the ingot relative to the wire saw thereby defining a position of the identification region of the wafer relative to the wire saw and positioning the ingot for slicing relative to the wire saw based on the defined identification region of each wafer.

5. The method of claim 1 wherein the slicing step includes feeding the wire saw and the ingot relatively toward each other along a linear feed path to force the wire and the ingot together during slicing and further comprising the step of providing a slurry to a contact area between the wire and the ingot and the step of controlling slurry density with a statistical process control to reduce thickness variations in the wafers.

6. The method of claim 1 wherein the semiconductor material is single crystal silicon.

7. A method of slicing ingots of semiconductor material into wafers using a wire saw, said ingots each including an outer surface having an alignment feature, said wire saw including a wire for slicing the ingots, said wire being movable in a forward direction and a reverse direction during slicing, said method comprising the steps of:

aligning the alignment feature of a first ingot in a position relative to the wire saw;

slicing the first ingot into wafers with the wire saw, said slicing step comprising:

moving the wire in the forward and reverse directions when slicing in a first region of each wafer; and moving the wire only in the forward direction when slicing in a second region of each wafer whereby thickness variations in each wafer are reduced in the second region of each wafer, said second region of each wafer defining an identification region adapted for marking with a series of laser-scribed marks after slicing, said laser-scribed marks forming an identification mark;

aligning the alignment feature of a second ingot in approximately the same position relative to the wire saw as the first ingot; and repeating the slicing step on the second ingot.

8. The method of claim 7 further comprising the step of defining the identification region of each wafer to be adjacent the alignment feature of the ingot being sliced.

9. The method of claim 8 further comprising the step of positioning each ingot for slicing relative to the wire saw based on each of the defined identification regions.

10. The method of claim 7 wherein the slicing step includes feeding the wire saw and each ingot relatively toward each other along a linear feed path to force the wire and the ingot being sliced together during slicing and further comprising the step of providing a slurry to a contact area between the wire and the ingot being sliced and the step of controlling slurry density with a statistical process control to reduce thickness variations in the wafers.

11. The method of claim 7 wherein the semiconductor material is single crystal silicon.

12. The method of claim 7 wherein the forward and reverse directions of the wire are generally perpendicular to a direction of slicing and wherein the aligning steps includes aligning the alignment feature of each ingot in a downward position relative to the direction of slicing.

13. A method of slicing an ingot of semiconductor material into wafers using a wire saw, said wire saw including a wire for slicing the ingot and a plurality of guides defining wire guide pitch, said wire being movable in a forward direction and a reverse direction during slicing, said method comprising the steps of:

defining an identification region of each wafer to be sliced from the ingot, said identification region being adapted for marking with an identification mark after slicing; and slicing the ingot into wafers with the wire saw, said slicing step comprising:

moving the wire in the forward and reverse directions during slicing except when slicing in the identification region of each wafer;

moving the wire only in the forward direction when slicing in the identification region of each wafer whereby thickness variations in each wafer relative to the size of the identification mark are reduced in the identification region; and controlling the wire guide pitch to reduce thickness variations between the wafers.

14. A method of slicing ingots of semiconductor material into wafers using a wire saw, said ingots each including an outer surface having an alignment feature, said wire saw including a wire for slicing the ingots and a plurality of guides defining wire guide pitch, said wire being movable in a forward direction and a reverse direction during slicing, said method comprising the steps of:

aligning the alignment feature of a first ingot in a position relative to the wire saw;

slicing the first ingot into wafers with the wire saw, said slicing step comprising:

moving the wire in the forward and reverse directions when slicing in a first region of each wafer; and moving the wire only in the forward direction when slicing in a second region of each wafer whereby thickness variations in each wafer are reduced in the second region of each wafer;

controlling the wire guide pitch to reduce thickness variations between the wafers;

aligning the alignment feature of a second ingot in approximately the same position relative to the wire saw as the first ingot; and repeating the slicing step on the second ingot.

* * * * *